US005954884A

United States Patent [19]
Lawing et al.

[11] Patent Number: 5,954,884
[45] Date of Patent: Sep. 21, 1999

[54] UV/HALOGEN METALS REMOVAL PROCESS

[75] Inventors: Andrew Scott Lawing, Phoenix, Ariz.; Robert T. Fayfield, St. Louis Park, Minn.; Herbert H. Sawin, Chestnut Hill; Jane Chang, Cambridge, both of Mass.

[73] Assignees: FSI International Inc., Chaska, Minn.; Massachusetts Institute of Technology, Cambridge, Mass.

[21] Appl. No.: 08/818,890

[22] Filed: Mar. 17, 1997

[51] Int. Cl.$^6$ ........................................................ B08B 3/12
[52] U.S. Cl. ........................ 134/1; 134/2; 134/3; 216/58; 216/66
[58] Field of Search ................... 134/1, 2, 3; 156/643.1; 216/58, 66

[56] References Cited

U.S. PATENT DOCUMENTS

| | | | |
|---|---|---|---|
| 4,498,953 | 2/1985 | Cook et al. | 156/646 |
| 5,094,701 | 3/1992 | Norman et al. | 148/23 |
| 5,178,721 | 1/1993 | Sugino | 156/626 |
| 5,198,388 | 3/1993 | Kawai | 437/173 |
| 5,213,621 | 5/1993 | Ivankovits et al. | 134/3 |
| 5,213,622 | 5/1993 | Bubling et al. | 134/3 |
| 5,221,366 | 6/1993 | Roberts et al. | 148/22 |
| 5,221,423 | 6/1993 | Sugino et al. | 156/643 |
| 5,332,444 | 7/1994 | George et al. | 134/1 |
| 5,356,514 | 10/1994 | Kinoshita | 156/643 |
| 5,431,774 | 7/1995 | Douglas | 216/57 |
| 5,470,799 | 11/1995 | Itoh et al. | 437/238 |
| 5,814,156 | 9/1998 | Elliott et al. | 134/1 |

FOREIGN PATENT DOCUMENTS

| | | |
|---|---|---|
| 0 637 063 A1 | 2/1995 | European Pat. Off. . |
| 1180187 | 2/1971 | United Kingdom . |

OTHER PUBLICATIONS

Lankard et al, "Laser assisted etching of chromium and copper" *Proceedings of the Syposium on Laser Processes for Microelectronic Applications*, pp. 113–122, Oct. 21–22 1987.

Meguro et al, "Tunable UV laser induced digital etching of GaAs: wavelength dependence of etch rate and surface processes", *Applied Surface Science Elsevier* vol. 106, pp. 365–268, Oct. 1996.

Sesselmann W; "Chemical Etching of Silicon Induced by Excimer Laser Radiation", *Chemtronics*, vol. 4, No. 3, Sep. 1, 1989.

Sugino et al, "Removal of Fe and Al on a Silicon Surface Using UV–Excited Dry Cleaning", *IEICE Transactions on Electronics*, vol. E75C, No. 5, pp. 829–833, Jul. 1992.

Yashuisa Sato et al , Reliability–Improvement of the MOS Structures Using Photo–Excited Dry Cleaning before Oxidation, *Japanese Journal of Applied Physics*, pp. 1103–1106, Jan. 1, 1990.

Sugino R. et al, "Characterization of Si–SiO$_2$ Interfaces Formed after Pho9to–Excited Cleaning", Japanese Journal of Applied Physics, pp. 417–420, Aug. 28, 1989.

C. Elsmore et al., "Comparison of HCl Gas Phase Cleaning With Conventional and Dilute Wet Chemistries" *Electrochemical Society Proceedings*, (1995), 142–149.

S. Lawing et al., "UV/Cl$_2$ Etching and Cleaning of Wafer Surfaces", *FSI International Technical Report*, (1995), 1–9.

T. Ito, "Wafer Cleaning With Photo–Excited Halogen Radicals", *Proceedings—Institute of Environmental Science*, (1991), 806–811.

R. Sugino et al., "Through–Oxide Cleaning of Silicon Surface by Photo–Excited Radicals", *Extended Abstracts of the 19th Conference on Solid State Devices and Materials*, Tokyo, 1987, 207–210.

R. Sugino et al., "Removal of Fe and Al on a Silicon Surface Using UV–Excited Dry Cleaning", *IECIC Trans. Electron.*, (Jul. 1992), 829–833.

T. Aoyama et al., "Surface Cleaning for Si Epitaxy Using Photoexcited Fluorine Gas", *J. Electrochem. Soc.*, vol. 140, No. 2, Feb. 1993, 366–371.

R. Sugino et al., "Dry Cleaning of Si and SiO$_2$ Surfaces using SiCl$_4$ System", *Fourth International Symposium on Semiconductor Manufacturing*, Sep. 1995, Austin TX, 262–265.

D. E. Ibbotson et al., "Selective Interhalogen Etching of Tantalum Compounds and Other Semiconductor Materials", *Appl. Phys. Lett*, 46(8) Apr. 1985 794–796.

*Primary Examiner*—Zeinab El-Arini
*Attorney, Agent, or Firm*—Vidas, Arretti & Steinkraus

[57] ABSTRACT

A chlorine based dry-cleaning system appropriate for removing metal contaminants from the surface of substrate is described in which the metal contaminant is chlorinated and reduced to a volatile metal chloride by UV irradiation. The process parameters of chlorine gas partial pressure, temperature, ultraviolet bandwidth, and/or the sequence of exposure of the substrate to the chlorine containing gas and to the ultraviolet radiation are selected so as to effect substantial removal of the metal without excessive substrate roughening.

11 Claims, 5 Drawing Sheets

UV/HALOGEN METALS REMOVAL PROCESS

BACKGROUND OF THE INVENTION

The present invention pertains to a process for gas phase removal of metals from substrates such as semiconductor devices and micromechanical devices.

The removal of trace metallic contamination is an important step in the semiconductor fabrication process. Trace metals can cause degradation of device performance if not removed from the wafer surface. Metallic contamination can arise from a number of sources including wet chemicals, photoresist, ion implantation and redeposition of sputtered materials from chamber surfaces during plasma processing.

Copper, in particular, is known to deposit from the hydrofluoric acid solutions commonly used to strip oxides in semiconductor fabrication. Aluminum alloyed with a small percentage of copper is commonly used to fabricate connecting metal lines in device fabrication. Copper is also present in small quantities in 304 and 316 stainless steels, common chamber and piping fabrication materials.

Particularly because of its tendency to deposit from HF solutions and therefore remain on the surface in an "HF last" cleaning sequence, copper is one of the most difficult transition metals to remove by traditional wet cleaning techniques.

Many different etching and cleaning techniques have been developed for various semiconductor processes. Typically in the past, wet etches, such as "RCA Clean", dominated in semiconductor fabrication processes. Gradually, as device structures have shrunk and the move toward VLSI devices grown, dry etches have gained prominence. These dry etches include plasma and gas-based etches and many were developed originally for removing oxides and carbon-based contaminants.

For dry gas-phase metal removal, several systems have been reported. U.S. Pat. No. 5,094,701 and U.S. Pat. No. 5,221,366 disclose use of beta-diketone and beta-ketoimine ligand forming compounds, which are dispersed in an oxidizing atmosphere. At a sufficient temperature, volatile metal-ligand complexes are reported to be formed and then sublimed from the surface. Temperatures of 200°–300° C. are indicated to be required. U.S. Pat. No. 5,213,621, U.S. Pat. No. 5,213,622, and U.S. Pat. No. 5,332,444 disclose other ligand forming chemical reagents which reportedly can be used in a similar manner to form volatile metal-ligand complexes with surface impurities which then can be sublimed from the surface.

Other dry gas-phase removal techniques involve the use of ultraviolet irradiation to generate cleaning radicals. Sugino et al. (IEIC Trans. Electron. Vol. E75-C No. 7, July 1992) describe a system for removal of Fe and Al on a silicon surface using photoexcited chlorine radicals at approximately 20 Torr and 170° C. as a cleaning gas. U.S. Pat. No. 5,221,423 to Sugino discloses a method for removing Al, Fe, Na and Cr by irradiating chlorine gas at a partial chlorine pressure of 20 Torr to produce chlorine radicals. U.S. Pat. No. 5,178,721 to Sugino discloses a UV radical generating cleaning method in which the pressure of the chlorine gas and the pathlength of the UV are varied to maximize radical generation and cleaning efficiency. In that system, the chlorine pressure ranges from 1 Torr to atmospheric pressure. Ito (Proc. Instit. for Environ. Studies 1991 p. 808) discloses a method for cleaning using photoexcited chlorine radicals wherein the chlorine is delivered at a pressure of 20 Torr. Unfortunately, techniques that rely on the generation of chlorine radicals are harsh on the substrate and on the cleaning apparatus because the chlorine radicals etch the substrate and cleaning apparatus in addition to the impurities.

There continues to be a need for improved processes for removal of trace metals from semiconductor substrates and substrates in micromechanical devices and the like, for processes that are not harsh on the substrate or processing equipment.

SUMMARY OF THE INVENTION

The main object of the present invention is to provide a process for removing metal contaminants from the surface of a substrate with minimal etching of the underlying substrate and minimal wear of the processing equipment. The invention in its various forms utilizes UV radiation to facilitate the creation of volatile metal chlorides.

In one aspect of the invention, a chlorinating gas is allowed to react with the substrate so as to form a metal chloride. The chlorinating gas is then removed and the metal chloride on the substrate exposed to UV radiation so as to reduce the metal chloride to a more volatile metal chloride.

In another aspect of the invention, the substrate is exposed to chlorine gas and simultaneously subjected to UV radiation that does not cause appreciable dissociation of the chlorine gas. By maintaining the chlorine gas at a low enough pressure, the production of volatile metal chloride will be favored over the production of non-volatile oxidized metal chloride.

In another aspect of the invention, the substrate is placed in a cleaning chamber wherein the substrate is maintained at a predetermined temperature and exposed to chlorine gas and UV radiation, the partial pressure of the chlorine gas being maintained at 1 Torr or less and the substrate temperature being kept at about 200° C. or less.

In yet another aspect of the invention, the substrate is placed in a cleaning chamber wherein the substrate is maintained at a pre-determined temperature and exposed to chlorine gas supplied at a pressure below ambient pressure and to ultraviolet radiation wherein the process parameters of chlorine gas partial pressure, temperature, ultraviolet bandwidth, and/or the sequence of exposure of the substrate to the chlorine containing gas and to the ultraviolet radiation are selected so as to effect substantial removal of metal without generating a silicon surface roughness greater than 10 Å RMS.

BRIEF DESCRIPTION OF THE DRAWINGS

FIG. 1 illustrates the effect of surface photolysis on copper removal in the UV/$Cl_2$ process.

FIG. 2 illustrates the effect of UV wavelength in reducing copper under low pressure chlorine gas.

FIG. 3 illustrates the effect of UV wavelength on copper reduction under vacuum.

FIG. 4 illustrates the effect of temperature on metal removal at 245 nm illumination.

FIG. 5 illustrates the effect of chlorine pressure under 245 nm illumination.

FIG. 6 illustrates the effectiveness of repeating the chlorination-evacuation-irradiation cycle in removing metals.

FIG. 7 illustrates the greatly increased reduction in metal in a flowing chlorine system at 50 mTorr due to broad band exposure to UV radiation at low pressure.

DETAILED DESCRIPTION OF THE INVENTION

Figure 1:
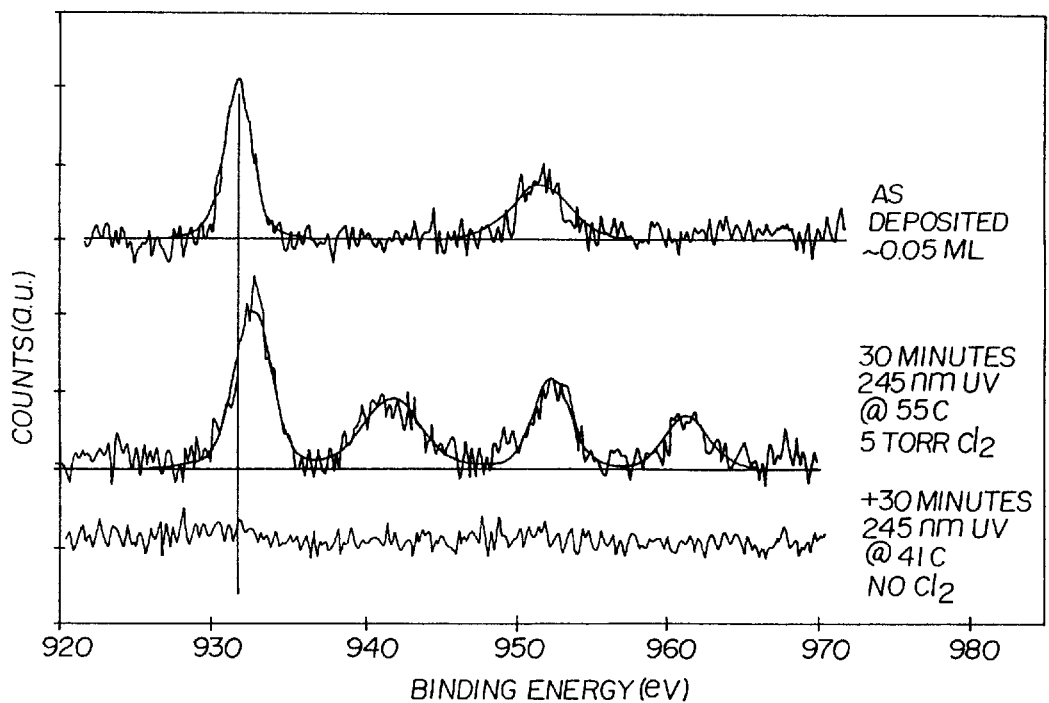
FIGS. 1–7 depict X-Ray 2p photoelectron spectra obtained from scans of silicon wafers contaminated with trace amounts of copper and subjected to cleaning in accordance with various embodiments of the invention.

An important feature of the invention is the recognition that metal volatilization appears to be facilitated when the metal is in the form of a low oxidation state metal chloride, while undesirable substrate roughening, especially silicon roughening, appears to be favored with high chlorine radical flux. By lowering the total available chlorine, by lowering the total available chlorine radical flux and/or by reducing excessively oxidized metal, more efficient metals removal can be accomplished at characteristic lower temperature, lower pressure and lower substrate damage than found with prior art UV/$C_2$ metals removal.

Broad spectrum UV includes wavelengths which favor dissociation of chlorine into radicals and wavelengths which favor reduction of metal chlorides. This provides the basis for several approaches to metal removal utilized in the present invention. In the first approach the metal is chlorinated and the use of UV radiation is limited to wavelengths that facilitate reduction of non-volatile metal chlorides to more volatile metal chlorides but that do not cause appreciable dissociation of chlorine gas. In the second approach, the metal is chlorinated, broadband UV radiation is used to facilitate reduction of metal chlorides and the production of chlorine radicals is eliminated by evacuating the chlorine gas prior to irradiation. These two approaches accomplish a common goal; reducing radical formation while facilitating reduction of metal chlorides. A third approach may also be taken: exposing the metal to chlorine gas at a low partial pressure of chlorine gas and simultaneously irradiating the metal with broadband UV radiation. In this approach, the formation of chlorine radicals and re-oxidation of metal chlorides is balanced by the reduction of metal chlorides and volatilization of the reduced species.

More generally, in addition to chlorine gas, other chlorinating gases may be used in some embodiments of the invention. It is expected that chlorinating gases, whose excitation or photodissociation spectrum does not overlap appreciably with the frequencies that enhance reduction of non-volatile metal chlorides to volatile metal chlorides will work in at least some embodiments of the invention, and that in processes where chlorination of the metal and irradiation are temporally separated, any gas which can effect chlorination of the metal to be removed may be useful.

In one embodiment of the invention, high purity chlorinating gas is introduced into the chamber and reacted with the substrate, in the absence of ultraviolet radiation, allowing for the formation of metal chloride on the surface of the substrate. Preferably, chlorine gas is used. However, any other gas capable of chlorinating the metal, for instance HCl, may also be used. The chlorinating gas is then removed from the chamber. Thereafter, UV radiation is directed toward the surface of the substrate, thereby creating a volatile metal chloride species. Unfiltered broadband UV radiation may be used. Preferably, the UV radiation comprises at least one wavelength at which the metal chloride is reduced to a more volatile metal chloride. The cycle of chlorination followed by evacuation and irradiation may be repeated until the desired quantity of copper is removed from the surface of the substrate. The number of repetitions of the cleaning cycle will depend on the amount of impurities to be removed and the desired level of cleanliness, in addition to operating parameters such as pressure. Optionally, ultraviolet radiation may be directed toward the substrate during the chlorination of the metal.

While it is an important feature of this embodiment that the chlorine gas be evacuated from the chamber, an inert gas may be present in the cleaning chamber during the irradiation step. Preferably the total gas pressure in the cleaning chamber during irradiation, after the chlorine gas has been removed, will be less than 1 atmosphere, more preferably about 100 Torr or less. However, in some cases at high inert gas sweeps it may be possible to effectively remove the volatile metal chloride species formed during irradiation even at pressures of 1 atmosphere or higher.

In the case of copper, UV radiation of a wavelength ranging from 235 nm to 255 nm is preferably employed so as to facilitate reduction of the metal chloride with an oxidation state of about 2 ($CuCl_2$) to a more volatile metal chloride with an oxidation state of about 1 (CuCl). Nevertheless, other wavelengths may be chosen for other metal chlorides. The wavelength of the ultraviolet radiation should comprise at least one wavelength at which the initially formed metal chloride is reduced to a more volatile metal chloride.

It is preferable that the substrate is maintained at a temperature ranging from 25° C. to 200° C. in this embodiment of the invention.

In another embodiment of the invention, metal is removed from the surface of the substrate by placing the substrate in a cleaning chamber and exposing the substrate to chlorine gas supplied at a pressure below ambient pressure in the presence of ultraviolet radiation that does not cause appreciable dissociation of the chlorine gas so as to facilitate the creation of volatile metal chlorides. The chlorine gas reacts with the metal to form a metal chloride on the surface of the substrate which, in the presence of the UV radiation is reduced to a more volatile metal chloride. The chlorine gas pressure will preferably be about 1 Torr or less, more preferably, about 500 mTorr or less, and still more preferably about 100 mTorr or less. Preferably, the total pressure in the cleaning chamber is less than 1 atmosphere, more preferably about 100 Torr or less, and still more preferably about 1 Torr or less. The substrate is suitably maintained at a temperature between 25° C. and 300° C., preferably about 150° C. or less and most preferably between 75° C. and 125° C. The frequency of the radiation along with the bandwidth and fluence of the radiation and the pressure of the chlorine gas are selected so as to effect removal of metals from the surface of the substrate and minimize substrate damage.

The UV radiation will preferably not include wavelengths between 260 nm and 450 nm. More preferably, the UV radiation will also include a substantial fluence of at least one wavelength between 235 nm and 255 nm. In the case where the metal is copper, it appears that the chlorine gas reacts with the metal on the surface of the substrate to form a copper chloride characterized by an oxidation number of about 2, and that this is facilitated by irradiation of the chlorine gas with light of wavelengths in the 260–450 nm region, apparently because of chlorine dissociation. However Cu(II) is efficiently reduced to a Cu(I) upon irradiation with ultraviolet radiation in the range of 235–255 nm, and CuCl is substantially more volatile than $CuCl_2$.

In this embodiment some overlap of the UV spectrum into wavelengths which favor chlorine dissociation over metal reduction can be accepted, since the effect of chlorine dissociation can be minimized by keeping chlorine partial pressure very low and removal of the reduced chloride species can be facilitated by minimizing the total chamber pressure. In the case of some overlap, therefore, the chlorine gas partial pressure and total chamber pressure should be controlled to a sufficiently low pressure to ensure that at least some of the metal chloride characterized by an oxidation number of about 1 formed on the surface of the substrate is volatilized before it can be converted back to metal chloride characterized by an oxidation number of about 2.

In another embodiment of the invention, metal is removed from the surface of the substrate by placing the substrate in a cleaning chamber wherein the substrate is maintained at a predetermined temperature of about 200° C. or less and exposing the substrate to chlorine gas supplied at a partial pressure below 1 Torr and to ultraviolet radiation. The chlorine gas pressure will preferably be about 500 mTorr or less and more preferably, about 100 mTorr or less. Preferably, the temperature of the substrate will be between 75° C. and 125° C.

The processes described above, alone or in combination, provide controllably low surface damage. Accordingly, in another embodiment, metal is removed from the surface of a silicon substrate by exposing the substrate to chlorine gas and UV irradiation in a process wherein the process parameters of chlorine gas partial pressure, substrate temperature, ultraviolet bandwidth and/or the sequence of exposure of the substrate to the chlorine containing gas and to the ultraviolet radiation are selected so as to effect substantial removal of the metal without generating a silicon surface roughness greater than 10 Å RMS. More preferably, the surface roughness is controlled to no greater than 5 Å RMS and most preferably, no greater than 2 Å RMS. Desirably the process parameters set forth above are further selected so as to provide a surface characterized by no more than about one monolayer of $SiCl_x$ thereon.

In this embodiment, the temperature of the substrate is preferably maintained between 25° C. and 150° C. The chlorine gas is supplied at a partial pressure of less than 1 Torr and more preferably about 100 mTorr or less.

In another embodiment, the metal removal processes described above may be used for etching a pattern into a thin metal coating on a substrate. High purity chlorine gas may be introduced into a chamber so as to react with a substrate to which a mask has been applied. Ultraviolet radiation, preferably of a wavelength of 235 nm to 255 nm, is directed toward the mask resting on the surface of the substrate. The metal is thereby removed from exposed areas of the substrate. Alternatively, a spatially focused source of ultraviolet radiation may be used in conjunction with the above metal removal processes to etch a pattern in the metal on the surface of the substrate.

Without being bound by a particular mechanism, it is presumed that in the case of copper, in the absence of UV irradiation, or in the presence of irradiation favoring chlorine dissociation, non-volatile $CuCl_2$ is formed on the substrate with the introduction of chlorine or other chlorinating gas. If the pressure of any chlorine gas present during the UV induced reduction of the metal chloride is too high the reduced metal chloride formed during irradiation will reoxidize to $CuCl_2$. Moreover, if the chlorine gas is exposed to UV radiation of a frequency that causes dissociation of the gas, the formation of $CuCl_2$ will be favored. If the system is irradiated at a frequency that does not promote radical formation, or if the chlorine pressure is kept low enough that radical production is starved, the photo-assisted reduction will predominate, thereby resulting in metal removal. While the particular species formed will depend on the metal being cleaned, it is contemplated that the general mechanism will involve a balancing of a photon assisted production of a volatile metal chloride species with both a photon induced undesirable production of chlorine radicals and the production of $CuCl_2$ that is favored at high chlorine gas partial pressures.

In all of the embodiments of the invention, the cleaning process may be carried out at a temperature ranging from 25° C. to 200° C.

Although described herein primarily in connection with a silicon wafer substrate, other substrates may also be employed in the invention. For instance substrates of any material providing an exposed surface film of silicon, silicon dioxide, or of other semiconductor materials such as SiGe or gallium arsenide. Such substrates may be semiconductor wafers, flat panels, or any other structure which may require a metals removal operation of the type described herein.

The invention is particularly advantageous for removal of copper because that metal is problematic in semiconductor manufacturing. However the invention may be applied to remove other common problem metals such as iron, aluminum, nickel and chromium. Other metals to which the invention may be applied include zinc, tantalum, tungsten, manganese, magnesium, titanium, niobium, calcium, vanadium, cobalt and sodium.

The invention is illustrated with reference to the following non-limiting examples.

EXAMPLES

For Examples 1–7, below, copper was deposited on the surface of the silicon wafers via sputter deposition. The wafers were then placed in the UV cleaning chamber for treatment. With the exception of Examples 6 and 7, the UV illumination system and monochromators used in these experiments provided approximately 1.5 mWatts/cm$^2$ and 3 mWatts/cm$^2$ at the 245 and 367 nm wavelengths respectively. In Examples 6 and 7, a 1 kilowatt high pressure mercury xenon lamp was used. The lamp provided an output of approximately 1 Watt/cm$^2$. Following treatment, the samples were analyzed via x-ray photoelectron spectroscopy (XPS). Metallic copper is characterized by a photoemission line occurring at 931.9 eV. A reference line has been included in all of the figures denoting the position of the main metallic copper line. $CuCl_2$ is characterized by a photoemission line occurring at nominally 932.6 eV although there is a tendency for the main peak to shift to higher binding energy at higher coverage. The main $CuCl_2$ line is readily identifiable lying slightly to the right of the reference line in the figures. It is further characterized by the presence of characteristic "shake-up"satellites. Finally, CuCl is characterized by a photoemission line occurring at nominally 931.2 eV, although it has been observed as low as 930.4 eV. The main CuCl line is readily identifiable lying slightly to the left of the reference line in the figures.

Example 1

In FIG. 1, the effect of 245 nm irradiation on $CuCl_2$ in the presence and absence of chlorine gas is shown. An initial copper coverage of approximately 0.05 of a monolayer (ML), as shown in the upper spectrum is exposed to 5 Torr of chlorine for 30 minutes under 245 nm illumination. The chlorine gas flow rate was 50 sccm. No diluent gasses were used. Little or no copper is removed from the surface, and further, all of the copper that remains on the surface is present as $CuCl_2$ as shown in the middle spectrum. However, when the chlorine gas is evacuated and the substrate exposed to 245 nm illumination, the copper is removed from the surface to the detection limit of XPS. Thus, in the absence of chlorine gas, ultraviolet irradiation at 245 nm reduces the metal chloride to a more volatile form. In the presence of chlorine gas, the reduction of the metal chloride to CuCl is competing with the oxidation of CuCl by the chlorine gas. At a total pressure of 5 Torr the production of $CuCl_2$ is favored.

Example 2

Figure 2:
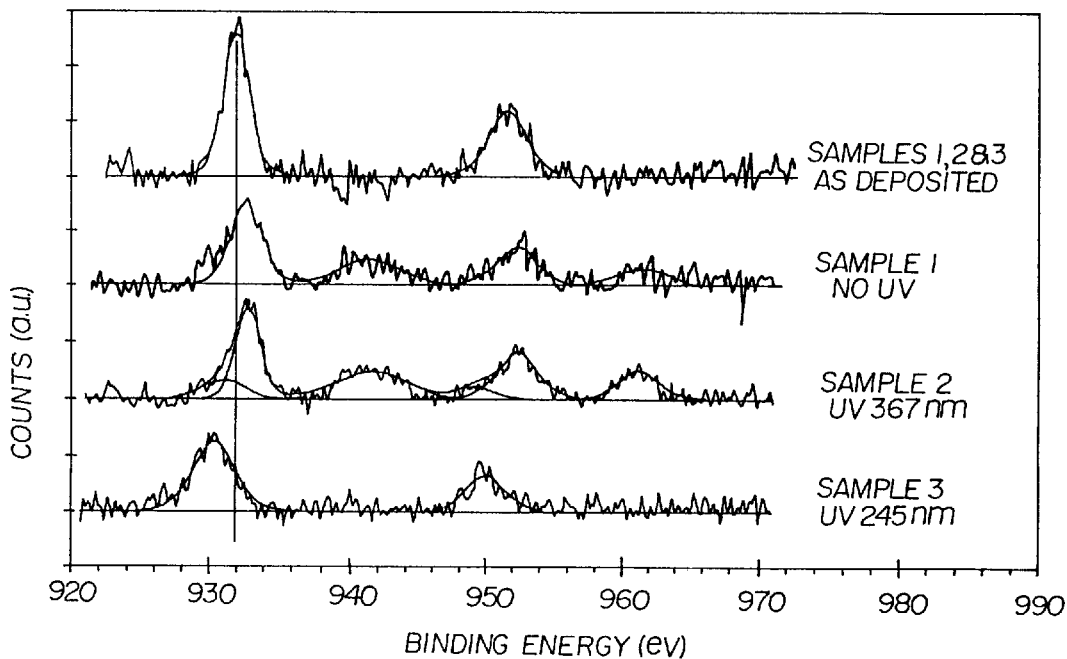

In FIG. 2, the effect of UV illumination at 20 mTorr chlorine and 65° C. is illustrated. In this example all three samples were characterized by an initial level of metallic copper (~0.1 ML) as represented by the uppermost spectrum. Sample 1 (second spectrum from the top) was held in the dark for 60 minutes, and all of the copper on this sample is present as $CuCl_2$. Sample 2 (third spectrum from the top) was exposed to 367 nm UV for 60 minutes, and the majority of the copper on this sample is present as $CuCl_2$. Sample 3 (bottom spectrum) was exposed to 245 nm UV for 60 minutes, and all of the copper on this sample is present as CuCl. In all three examples, the chlorine gas partial pressure was 20 mTorr and the total pressure 750 mTorr, the additional pressure coming from nitrogen gas. The total flow rate was 200 sccm. The temperature of the substrate was maintained at 65° C. At 367 nm, the reduction of $CuCl_2$ to CuCl is offset by the chlorination due to gas phase production of atomic chlorine. At 245 nm, where no significant dissociation of chlorine takes place, the reduction of $CuCl_2$ to the more volatile CuCl takes places.

Example 3

Figure 3:
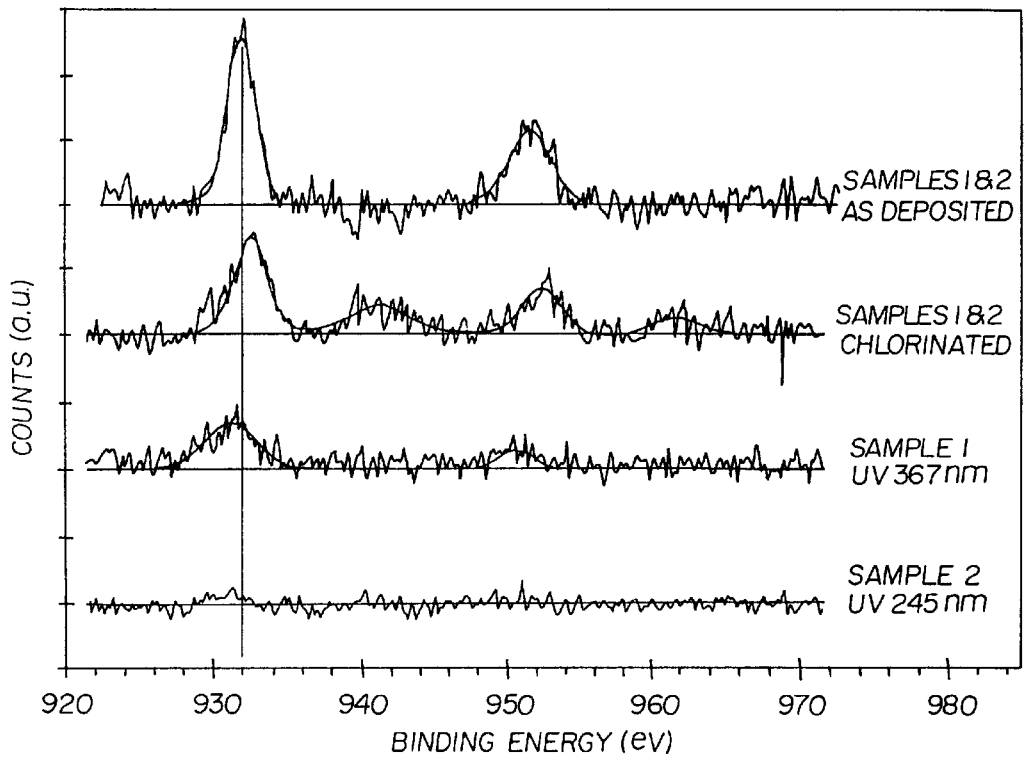

In FIG. 3, the effect of UV illumination on pre-chlorinated samples is shown at 367 nm and 245 nm. In the experiments illustrated in FIG. 3, two samples characterized by an initial level of metallic copper of ≈0.1 ML as shown in the uppermost spectrum, were pre-chlorinated in the dark, and then illuminated under vacuum at a pressure of ≈$1 \times 10^{-7}$ Torr. The level of $CuCl_2$ after chlorination is shown in the second spectrum. Sample 1 was illuminated with 367 nm light while sample 2 was illuminated with 245 nm light. Both samples 1 and 2 exhibit copper removal. The copper remaining on the surface of sample 1 is in the form of CuCl. Copper is removed to close to the XPS detection limit on sample 2. While irradiating the substrate at 367 nm under vacuum will remove copper metal, it will not remove it as efficiently as irradiating the substrate at 245 nm.

Example 4

Figure 4:
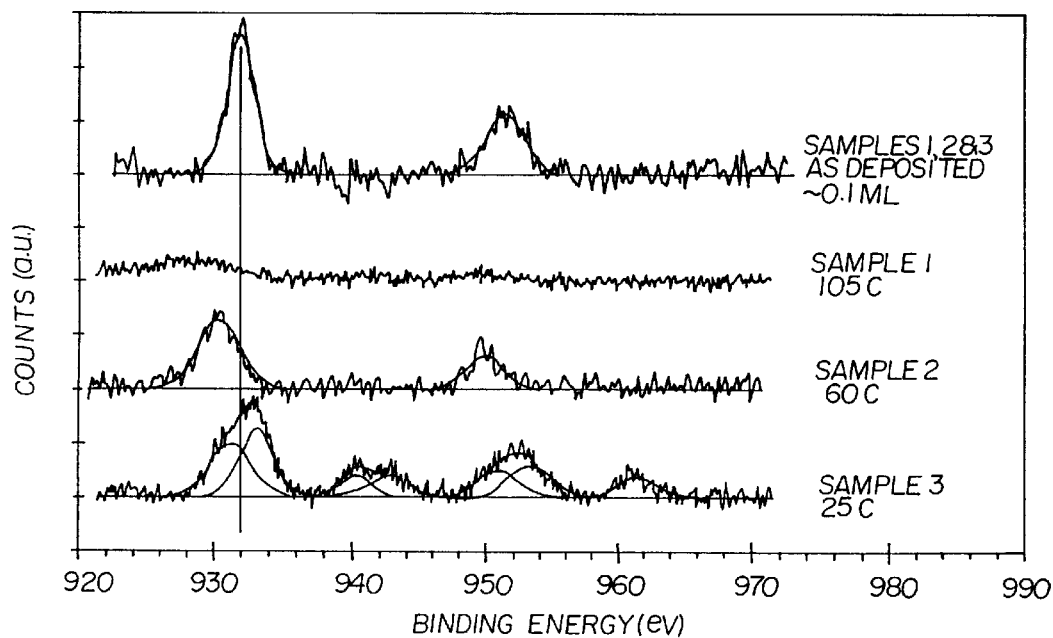

FIG. 4 illustrates the effect of temperature on metal removal under 245 nm illumination. Three samples are represented in the figure. All three samples were characterized by the initial coverage level of ≈0.1 ML shown in the uppermost spectrum. All three samples were illuminated with 245 nm light at a chlorine pressure of 20 mTorr for 60 minutes. As in example 2, the total pressure was 750 mTorr, with the additional pressure coming from nitrogen gas diluent. The total flow rate was 200 sccm. Sample 1 was held at 105° C. and exhibits copper removal to nearly the XPS detection limit. Sample 2 was held at 60° C. All of the copper remaining on sample 2 is in the form of CuCl, and about half of the initial level of copper has been removed. Sample 3 was held at 25° C. Sample 3 exhibits a mixed composition of $CuCl_2$ and CuCl, and exhibits little or no reduction in the initial level of copper.

Example 5

Figure 5:
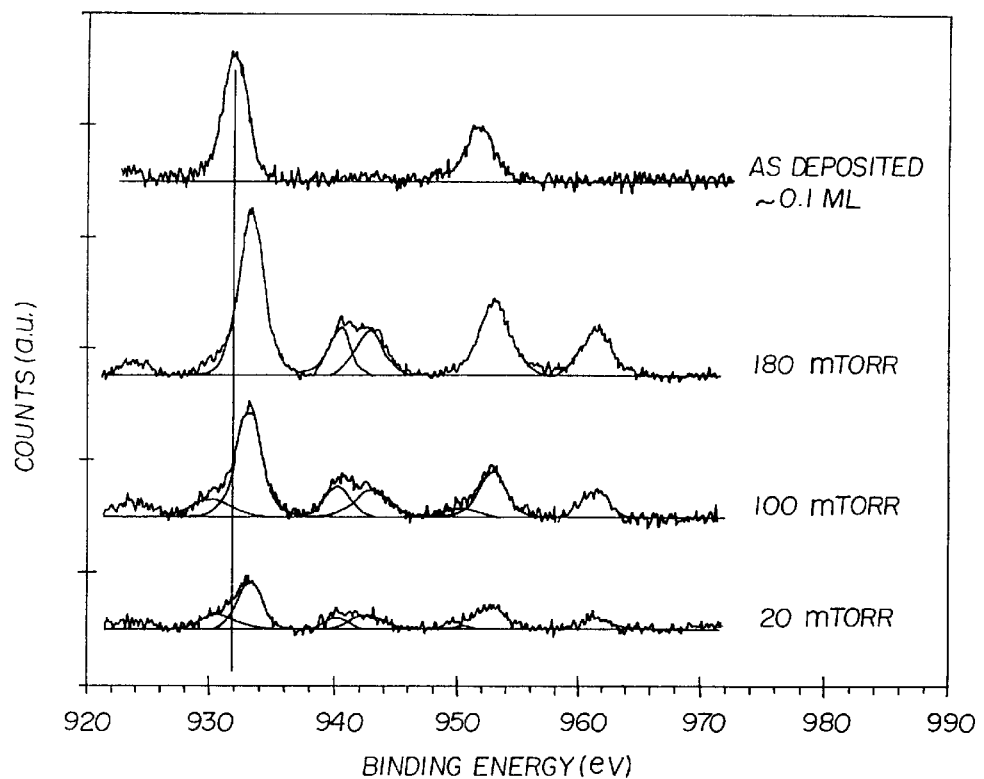

FIG. 5 illustrates the effect of chlorine pressure under 245 nm illumination. Again three samples are represented. All three samples were characterized by the initial coverage level of ≈0.1 ML as shown in the uppermost spectrum. All three samples were illuminated with 245 nm light at 75° C. for 60 minutes. A clear increase in the efficiency of copper removal is evident as the pressure is decreased from 180 mTorr to 20 mTorr. Nitrogen gas was present as a diluent. The total pressure was approximately 1 Torr while the flow rate of the gasses was approximately 200 sccm.

In the examples below, the monochromator has been removed from the illumination system. Thus, the samples are exposed to the full bandwidth and fluence of the UV lamp. The sample thus receives a much higher photon flux than the experiments illustrated in FIGS. 1–5.

Example 6

Figure 6:
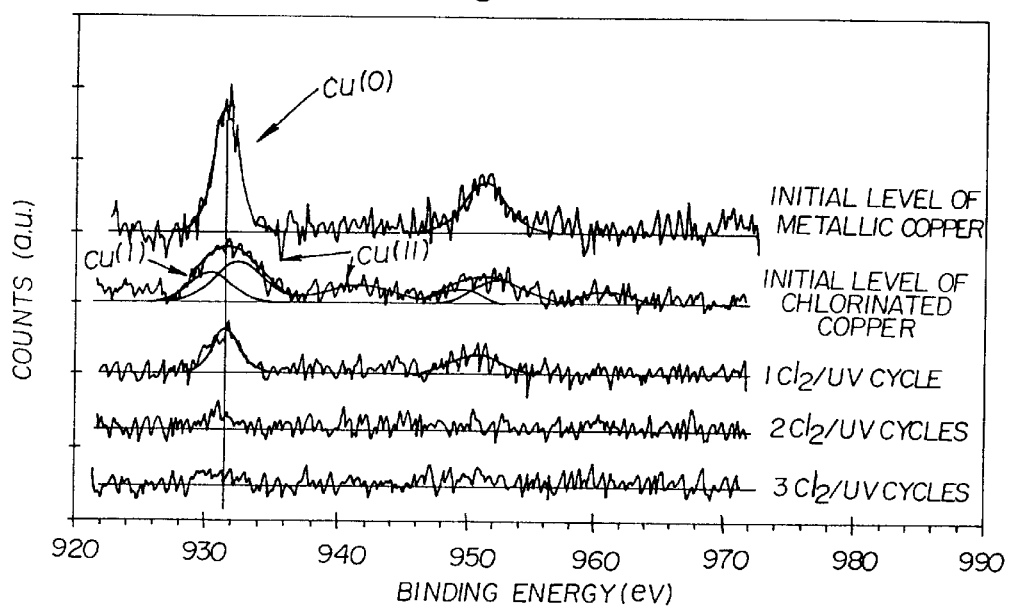

FIG. 6 demonstrates the removal of copper with subsequent cycles of chlorination, evacuation and irradiation. In this process the sample, having a Cu deposit of about 0.05 monolayer, is exposed to chlorine gas for 1 minute in the dark. The pressure of the chlorine gas was approximately 5 Torr. The chamber was then evacuated and the sample exposed to UV illumination under vacuum at a pressure of ≈$1 \times 10^{-7}$ Torr for 30 seconds at 40° C. FIG. 6 shows the initial levels of metallic and chlorinated copper as well as the post process spectra for each of three UV exposure cycles. Again, the sample was exposed to chlorine before each UV cycle although only one of the chlorinated spectra is shown. With the much more intense and broad band radiation from the full lamp fluence, UV illumination is capable of completely reducing copper chlorides to metallic copper in less than thirty seconds. In fact, the efficiency of the reduction process is such that we must repeat the chlorination/UV exposure cycle three times to remove copper to the XPS detection limit. The UV reduction kinetics are such that the copper is reduced completely to Cu(0) before it can be removed from the surface as CuCl.

Example 7

Figure 7:
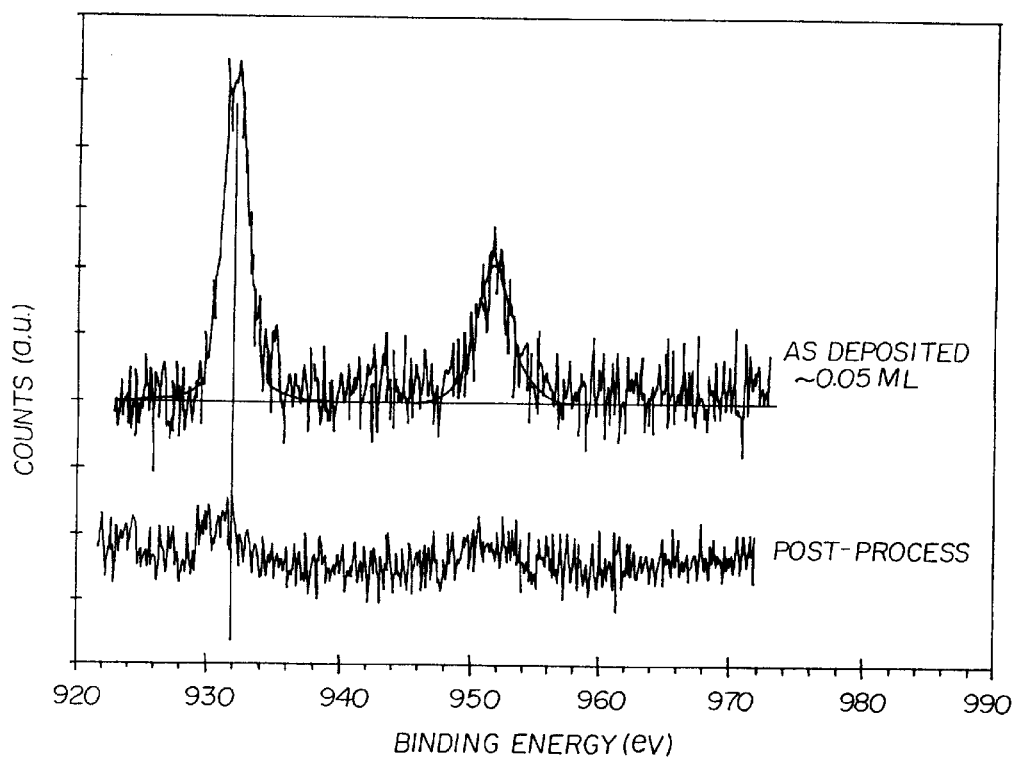

In this process the sample, having a Cu deposit of about 0.05 monolayer, is exposed to UV illumination in flowing chlorine gas at a pressure of 50 mTorr for 60 seconds at 75° C. Total pressure was 1 Torr, with the additional pressure resulting from nitrogen diluent. The total flow rate of the chlorine and nitrogen gasses was approximately 200 sccm. Copper is removed to near the detection limit after this process. FIG. 7 illustrates the greatly increased reduction rate due to the exposure to the more intense broad band radiation of the full lamp fluence.

Example 8

Figure 8:
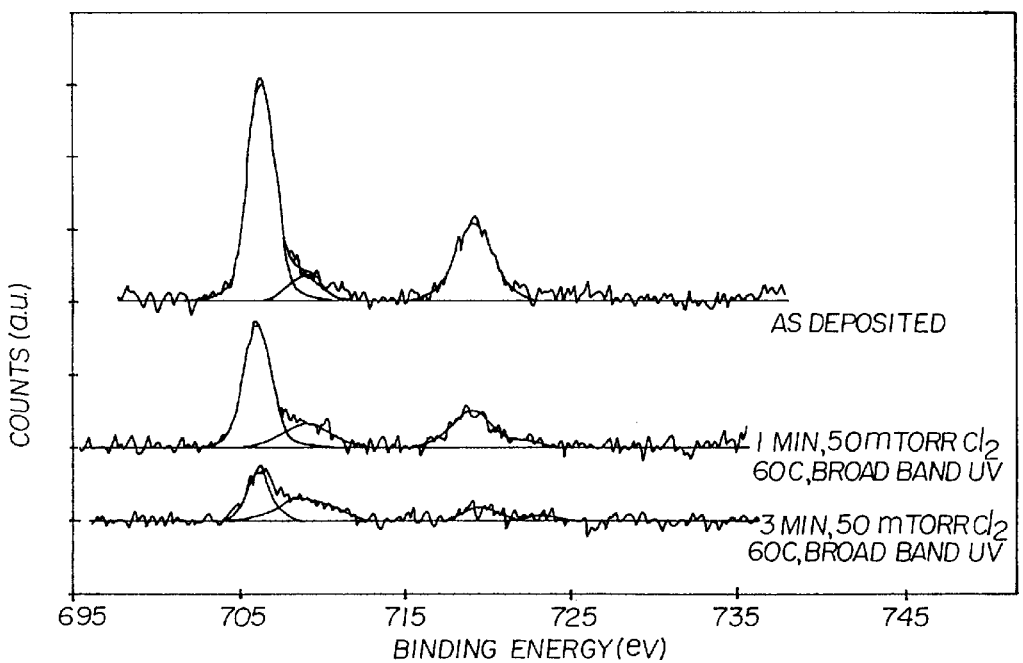
FIG. 8 are spectra obtained under similar conditions to that of FIG. 7 except that the contamination removed was iron.

The process of Example 7 was repeated except that the silicon wafer substrate used had deposited thereon a quantity (about 0.1 monolayer) of iron instead of copper, and the process was run at 60° C. for a longer time. The spectra in FIG. 8 were taken in the region of 695–735 eV. Spectra taken after 1 and 3 minutes process times demonstrate progressive removal of the iron deposit.

Example 9

Figure 9:
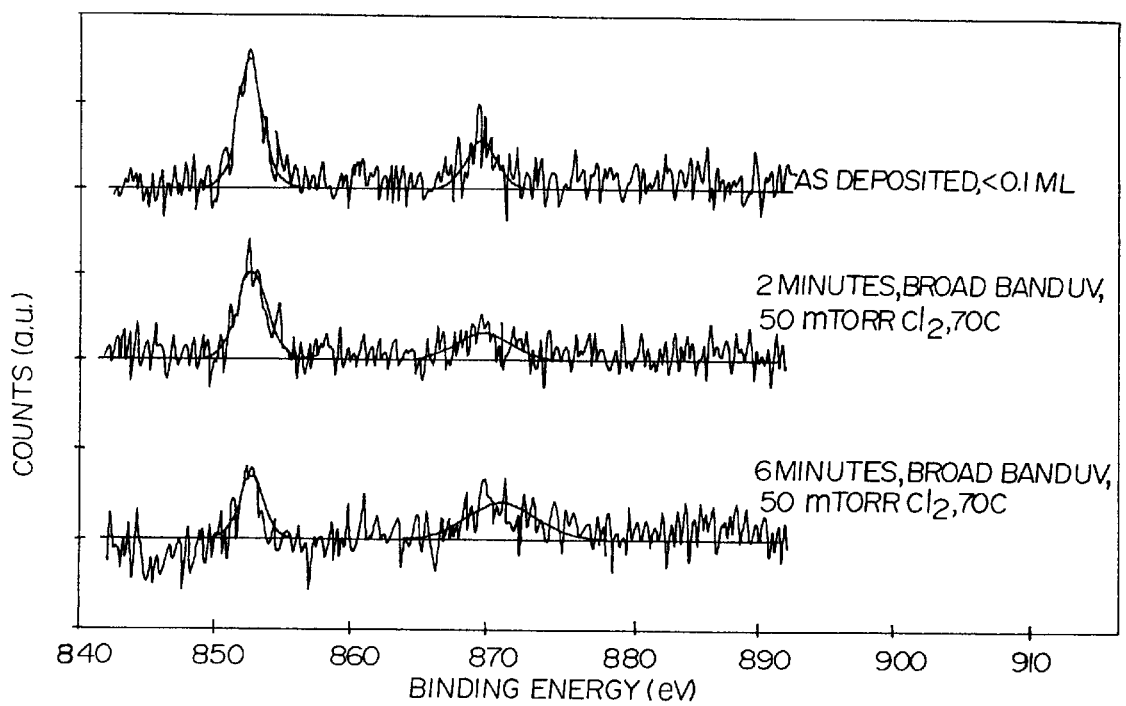
FIG. 9 are spectra obtained under similar conditions to that of FIG. 7 except that the contamination removed was nickel.

The process of Example 7 was repeated except that the silicon wafer substrate had deposited thereon a quantity (somewhat less than 0.1 monolayer) of nickel instead of copper and the process was run at 70° C. for a longer time. The spectra in FIG. 9 were taken in the region of 840–890 eV. Spectra taken after 2 and 6 minutes process times demonstrate progressive removal of the nickel deposit.

What is claimed is as follows:

1. A method of cleaning a surface of a substrate to remove metal from the surface of the substrate by placing the substrate in a cleaning chamber, and performing the steps of:
   i) feeding chlorinating gas into the cleaning chamber in the absence of ultraviolet radiation;
   ii) allowing the chlorinating gas to react with the surface of the substrate in the absence of ultraviolet radiation;
   iii) removing the chlorinating gas from the cleaning chamber in the absence of ultraviolet radiation; and subsequently
   iv) irradiating the substrate with ultraviolet radiation in the absence of chlorinating gas so as to effectuate the removal of metal from the surface of the substrate.

2. The method of claim 1 wherein the cleaning chamber is characterized by a pressure in step iv) of about 1 atmosphere or less.

3. The method of claim 1 wherein steps i)–iv) are repeated until a predetermined quantity of the metal is removed.

4. The method of claim 1 wherein the metal is selected from the group consisting of Copper, Iron, Aluminum, Nickel, Chromium, Zinc, Tantalum, Tungsten, Manganese, Magnesium, Titanium, Niobium, Calcium, Vanadium, Cobalt and Sodium.

5. The method of claim 1 wherein the metal is selected from the group consisting of Copper, Iron, Aluminum, Nickel, and Chromium.

6. The method of claim 1 wherein the chlorinating gas reacts with the metal on the surface of the substrate to form a metal chloride and the ultraviolet radiation comprises at least one wavelength at which the metal chloride is reduced to a more volatile metal chloride.

7. The method of claim 1 wherein the metal is copper and the chlorinating gas reacts with the metal on the surface of the substrate to form a metal chloride characterized by an oxidation number of about 2 which is reduced to a metal chloride characterized by an oxidation number of about 1 upon irradiation with the ultraviolet radiation.

8. The method of claim 1 wherein the substrate is maintained at a temperature ranging from 25° C. to 200° C.

9. The method of claim 1 wherein said chlorinating gas is chlorine gas.

10. A method of treating a substrate to remove metal from a surface of the substrate by placing the substrate in a chamber, and performing the steps of:
   i) feeding chlorinating gas into the cleaning chamber in the absence of ultraviolet radiation;
   ii) allowing the chlorinating gas to react with said portion of the surface of the substrate in the absence of ultraviolet radiation;
   iii) removing the chlorinating gas from the chamber in the absence of ultraviolet radiation; and subsequently
   iv) irradiating the substrate with ultraviolet radiation in the absence of chlorinating gas so as to effectuate the removal of metal.

11. The method of claim 10 wherein said ultraviolet radiation is used to etch a pattern in the metal on the surface of the substrate.

* * * * *

UNITED STATES PATENT AND TRADEMARK OFFICE
CERTIFICATE OF CORRECTION

PATENT NO. : 5,954,884

DATED : September 21,1999

INVENTOR(S) : Andrew S. Lawing et al

It is certified that error appears in the above-identified patent and that said Letters Patent is hereby corrected as shown below:

On the face, Col. 2, of the issued patent, under *"Attorney, Agent, or Firm"* delete "Arretti" and insert -- Arrett --;

Col. 10, line 21, delete "cleaning" before the word chamber;

Col. 10, lines 23 & 24, delete "said portion of".

Signed and Sealed this

Third Day of April, 2001

Attest:

NICHOLAS P. GODICI

Attesting Officer

Acting Director of the United States Patent and Trademark Office